US012345748B2

(12) United States Patent
Cao et al.

(10) Patent No.: US 12,345,748 B2
(45) Date of Patent: Jul. 1, 2025

(54) REMOVING TEST EQUIPMENT INTERMODULATION INTERFERENCE AND NOISE FROM POWER SPECTRAL DENSITY MEASUREMENTS

(71) Applicant: LitePoint Corporation, San Jose, CA (US)

(72) Inventors: Chen Cao, Shanghai (CN); Christian Volf Olgaard, Saratoga, CA (US); Ruizu Wang, Santa Clara, CA (US); Qingjie Lu, Shanghai (CN)

(73) Assignee: LitePoint Corporation, San Jose, CA (US)

( * ) Notice: Subject to any disclaimer, the term of this patent is extended or adjusted under 35 U.S.C. 154(b) by 165 days.

(21) Appl. No.: 18/143,886

(22) Filed: May 5, 2023

(65) Prior Publication Data

US 2024/0361367 A1    Oct. 31, 2024

(30) Foreign Application Priority Data

Apr. 26, 2023 (CN) .......................... 202310462931.2

(51) Int. Cl.
  *G01R 23/18* (2006.01)
  *G01R 27/30* (2006.01)
  *G01R 29/26* (2006.01)

(52) U.S. Cl.
  CPC ............. *G01R 23/18* (2013.01); *G01R 27/30* (2013.01); *G01R 29/26* (2013.01)

(58) Field of Classification Search
  CPC ................ G01R 31/2837; G01R 23/18; G01R 31/2841; G01R 23/163; G01R 31/00; G01R 27/30; G01R 29/26

(Continued)

(56) References Cited

U.S. PATENT DOCUMENTS 3,876,946 A * 4/1975 La Clair ................ G01R 23/18
  324/76.23
6,229,316 B1  5/2001 Fukui et al.
(Continued)

FOREIGN PATENT DOCUMENTS

CN  109633294 A * 4/2019 ............. G01R 29/26
CN  114384457 A * 4/2022 ........... G01R 35/005

OTHER PUBLICATIONS

Simon, M., "Interaction of Intermodulation Products between DUT and Spectrum Analyzer: White Paper," Rohde & Schwarz, Application Note (Dec. 2012), 1MA219_2e, 16 pages.
(Continued)

*Primary Examiner* — Tung X Nguyen
*Assistant Examiner* — Robert P Alejnikov, Jr.
(74) *Attorney, Agent, or Firm* — ArentFox Schiff LLP

(57) ABSTRACT

An example method includes following operations: (i) receiving a device signal from a device under test (DUT); (ii) setting an attenuation value; (iii) applying the attenuation value to the device signal to produce an attenuated device signal for a frequency spectrum analyzing device, where the frequency spectrum analyzing device produces a noise signal and intermodulation interference; (iv) obtaining a power spectral density value, where the power spectral density value comprises a power, at a frequency value, of a combined signal that is based on the attenuated device signal, the noise signal, and the intermodulation interference; (v) repeating operations (ii), (iii), and (iv) one or more times to produce multiple power spectral density values; (vi) repeating operations (i), (ii), (iii), (iv), and (v) one or more times to add power spectral density values to the multiple power spectral density values; and (vii) obtaining a power spectral density of the device signal.

24 Claims, 6 Drawing Sheets

(58) Field of Classification Search
USPC .......................................................... 324/613
See application file for complete search history.

(56) References Cited

U.S. PATENT DOCUMENTS

| | | |
|---|---|---|
| 6,542,740 B1 | 4/2003 | Olgaard et al. |
| 7,093,017 B1 | 8/2006 | Olgaard et al. |
| 7,167,682 B1 | 1/2007 | Madsen et al. |
| 7,363,188 B1 | 4/2008 | Olgaard et al. |
| 7,457,712 B1 | 11/2008 | Madsen et al. |
| 7,457,995 B1 | 11/2008 | Madsen et al. |
| 7,484,146 B2 | 1/2009 | Olgaard et al. |
| 7,519,383 B2 | 4/2009 | Olgaard |
| 7,564,896 B2 | 7/2009 | Olgaard |
| 7,567,521 B2 | 7/2009 | Olgaard et al. |
| 7,772,922 B1 | 8/2010 | Olgaard et al. |
| 8,036,617 B2 | 10/2011 | Olgaard |
| 8,189,483 B2 | 5/2012 | Olgaard et al. |
| 8,780,966 B1 | 7/2014 | Olgaard et al. |
| 8,879,659 B1 | 11/2014 | Olgaard |
| 9,015,538 B2 | 4/2015 | Olgaard |
| 9,077,535 B2 | 7/2015 | Olgaard |
| 9,116,187 B1* | 8/2015 | Owen .................... G01R 27/28 |
| 9,497,101 B2 | 11/2016 | Olgaard et al. |
| 9,749,065 B2 | 8/2017 | Olgaard et al. |
| 9,749,066 B2 | 8/2017 | Olgaard et al. |
| 9,780,893 B2 | 10/2017 | Olgaard |
| 9,794,009 B1 | 10/2017 | Olgaard et al. |
| 9,825,717 B2 | 11/2017 | Olgaard et al. |
| 9,871,601 B2 | 1/2018 | Olgaard et al. |
| 9,923,647 B1 | 3/2018 | Olgaard et al. |
| 10,009,126 B2 | 6/2018 | Olgaard et al. |
| 10,079,626 B1 | 9/2018 | Olgaard et al. |
| 10,084,555 B1 | 9/2018 | Olgaard et al. |
| 10,097,282 B1 | 10/2018 | Chao et al. |
| 10,326,540 B2 | 6/2019 | Olgaard et al. |
| 10,404,609 B2 | 9/2019 | Cao et al. |
| 10,536,226 B1 | 1/2020 | Huynh et al. |
| 10,666,538 B2 | 5/2020 | Olgaard |
| 10,666,542 B1 | 5/2020 | Olgaard et al. |
| 10,819,616 B2 | 10/2020 | Olgaard et al. |
| 11,032,725 B1 | 6/2021 | Olgaard et al. |
| 11,598,803 B1 | 3/2023 | Cao et al. |
| 11,742,970 B1 | 8/2023 | Cao et al. |
| 11,817,913 B1 | 11/2023 | Cao et al. |
| 11,835,563 B2 | 12/2023 | Huynh et al. |
| 11,838,776 B2 | 12/2023 | Olgaard et al. |
| 11,855,707 B2 | 12/2023 | Cao et al. |
| 2007/0070691 A1 | 3/2007 | Walvis et al. |
| 2007/0070881 A1 | 3/2007 | Olgaard et al. |
| 2007/0243825 A1 | 10/2007 | Olgaard et al. |
| 2008/0127008 A1 | 5/2008 | Bouas et al. |
| 2008/0172588 A1 | 7/2008 | Olgaard |
| 2008/0285467 A1 | 11/2008 | Olgaard |
| 2008/0287117 A1 | 11/2008 | Olgaard et al. |
| 2008/0293363 A1 | 11/2008 | Olgaard |
| 2008/0320345 A1 | 12/2008 | Olgaard |
| 2009/0092053 A1 | 4/2009 | Olgaard |
| 2009/0307331 A1 | 12/2009 | Olgaard et al. |
| 2009/0319826 A1 | 12/2009 | Olgaard et al. |
| 2010/0007355 A1 | 1/2010 | Olgaard et al. |
| 2010/0008237 A1 | 1/2010 | Olgaard et al. |
| 2010/0123471 A1 | 5/2010 | Olgaard et al. |
| 2010/0156438 A1* | 6/2010 | Gorin .................... G01R 23/16 324/624 |
| 2010/0261431 A1 | 10/2010 | Olgaard |
| 2011/0069624 A1 | 3/2011 | Olgaard |
| 2011/0090799 A1 | 4/2011 | El-Hassan et al. |
| 2011/0292809 A1 | 12/2011 | Olgaard et al. |
| 2011/0314333 A1 | 12/2011 | Olgaard et al. |
| 2012/0051224 A1 | 3/2012 | Olgaard et al. |
| 2012/0113829 A1 | 5/2012 | Olgaard et al. |
| 2012/0213112 A1 | 8/2012 | Olgaard et al. |
| 2012/0269288 A1 | 10/2012 | Olgaard et al. |
| 2013/0028100 A1 | 1/2013 | Olgaard |
| 2013/0122845 A1 | 5/2013 | Loewenstein |
| 2013/0188678 A1 | 7/2013 | Olgaard et al. |
| 2013/0234728 A1 | 9/2013 | Olgaard et al. |
| 2013/0259097 A1 | 10/2013 | Olgaard et al. |
| 2013/0294252 A1 | 11/2013 | Olgaard et al. |
| 2013/0294255 A1 | 11/2013 | Olgaard et al. |
| 2013/0295858 A1 | 11/2013 | Olgaard et al. |
| 2013/0301694 A1 | 11/2013 | Olgaard |
| 2013/0326274 A1 | 12/2013 | Olgaard et al. |
| 2014/0024315 A1 | 1/2014 | Olgaard et al. |
| 2014/0169181 A1 | 6/2014 | Olgaard et al. |
| 2014/0169182 A1 | 6/2014 | Olgaard et al. |
| 2014/0181601 A1 | 6/2014 | Olgaard et al. |
| 2014/0233405 A1 | 8/2014 | Olgaard |
| 2014/0256268 A1 | 9/2014 | Olgaard |
| 2014/0269365 A1 | 9/2014 | Olgaard et al. |
| 2015/0036729 A1 | 2/2015 | Olgaard et al. |
| 2015/0058691 A1 | 2/2015 | Olgaard et al. |
| 2015/0063133 A1 | 3/2015 | Olgaard et al. |
| 2015/0078196 A1 | 3/2015 | Olgaard |
| 2015/0138998 A1 | 5/2015 | Olgaard et al. |
| 2015/0139023 A1 | 5/2015 | Olgaard et al. |
| 2015/0149839 A1 | 5/2015 | Olgaard |
| 2015/0192639 A1 | 7/2015 | Olgaard |
| 2015/0253357 A1 | 9/2015 | Olgaard |
| 2015/0256274 A1 | 9/2015 | Olgaard et al. |
| 2015/0304864 A1 | 10/2015 | Olgaard |
| 2018/0219705 A1* | 8/2018 | Hairfield ........... H04L 25/03159 |
| 2018/0351664 A1 | 12/2018 | Olgaard et al. |
| 2020/0011912 A1* | 1/2020 | Quan ........................ H03F 1/26 |

OTHER PUBLICATIONS

Kearney et al., "Passive Intermodulation (PIM) Effects in Base Stations: Understanding the Challenges and Solutions," Analog Devices, Analog Dialogue 51-03, URL: https://www.analog.com/en/analog-dialogue/articles/passive-intermodulation-effects-in-base-stations-understanding-the-challenges-and-solutions.html (Mar. 2017), 5 pages.
Extended European Search Report issued in EP24158142.0, dated Jul. 22, 2024 (11 pages).
Yannick Gruson et al: "Artifacts and errors in cross-spectrum phase noise measurements", Metrologia, Institute of Physics Publishing, Bristol, GB, vol. 57, No. 5, Aug. 19, 2020 (Aug. 19, 2020), p. 55010, XP020357094, ISSN: 0026-1394, DOI: 10.1088/1681-7575/AB8D7B.
Mark S. Oude Alink et al: "A CMOS-Compatible Spectrum Analyzer for Cognitive Radio Exploiting Crosscorrelation to Improve Linearity and Noise Performance", IEEE Transactions on Circuits and Systems I: Regular Papers, IEEE, US, vol. 59, No. 3, Mar. 1, 2012 (Mar. 1, 2012), pp. 479-492, XP011454322, ISSN: 1549-8328, DOI 10.1109/TCSI.2011.2167266.
Alan E. Rogers et al: "Extending the Dynamic Range of a Spectrum Monitor Using Comparison Switching and Spectral Averaging", IEEE Transactions on Instrumentation and Measurement, IEEE, USA, vol. 57, No. 3, Mar. 1, 2008 (Mar. 1, 2008), pp. 591-594, XP011199145, ISSN: 0018-9456, DOI: 10.1109/TIM.2007.911616.
"Draft IEEE Standard for Digitizing Waveform Recorders", IEEE Draft; IEEESTD1057SMMARKUP8_11_06, IEEE-SA, Piscataway, NJ USA, vol. 1057, Sep. 4, 2006 (Sep. 4, 2006), pp. 1-171, XP017609259.
Extended European Search Report issued in EP24159131.2, mailed Jul. 3, 2024 (10 pages).
Non-Final Office Action received for U.S. Appl. No. 18/144,019, mailed on Dec. 17, 2024, 16 pages.

* cited by examiner

REMOVING TEST EQUIPMENT INTERMODULATION INTERFERENCE AND NOISE FROM POWER SPECTRAL DENSITY MEASUREMENTS

CROSS-REFERENCE TO RELATED APPLICATIONS

This application claims priority to Chinese patent application number 202310462931.2 which was filed on Apr. 26, 2023. The contents of Chinese patent application number 202310462931.2 are incorporated herein by reference.

TECHNICAL FIELD

This specification describes example implementations of techniques for removing test equipment intermodulation interference and test equipment noise from power spectral density measurements of a device signal.

BACKGROUND

Power spectral density, or "PSD", specifies the power levels of frequency components present in a signal. Essentially, the PSD defines the relationship between the power of a signal and the frequency of the signal.

Test equipment is configured to test the operation of electronic devices referred to as devices under test (DUTs). A frequency spectrum analyzing device is a component of test equipment that, among other things, is configured to measure the PSD of a signal from DUT ("the DUT signal"). An example of a frequency spectrum analyzing device is a vector signal analyzer (VSA), During operation, the VSA adds noise and distortion to the DUT signal. In some types of VSAs, particularly older or "legacy" VSAs, the noise added by the VSA to parts of the DUT signal makes PSD measurements of the DUT signal inaccurate or not possible.

Intermodulation (IM) is a result of high-power tones in a signal, such as the DUT signal, mixing at any nonlinearities, which may occur in, e.g., active test equipment components. IM creates unwanted spurious emissions in the form of sidebands and increases occupied signal bandwidth, which may lead to adjacent channel interference. Third-order IM (IM3) interference is most dominant among all IM interference, as it will be the largest and fall in the radio frequency (RF) bandwidth of signal receivers. For example, FIG. 1 shows an ideal signal 100 at two frequencies, f1 and f2, and IM3 interference in the form of sidebands 101 and 102 added to the signal. This example signal of FIG. 1 could be generated by passively combining two signals and then feeding the result into a VSA. Given this, the intermodulation product would originate from the VSA and not the signal that was input to the VSA In this regard, both the DUT and the test equipment, e.g., the VSA, may generate IM interference. The IM interference generated by the VSA will typically have a negative impact on PSD measurements of a DUT signal.

SUMMARY

An example method includes following operations: (i) receiving a device signal from a device under test (DUT); (ii) setting an attenuation value; (iii) applying the attenuation value to the device signal to produce an attenuated device signal for a frequency spectrum analyzing device, where the frequency spectrum analyzing device produces a noise signal and intermodulation interference; (iv) obtaining a power spectral density value, where the power spectral density value includes a power, at a frequency value, of a combined signal that is based on the attenuated device signal, the noise signal, and the intermodulation interference; (v) repeating operations (ii), (iii), and (iv) one or more times to produce multiple power spectral density values; (vi) repeating operations (i), (ii), (iii), (iv), and (v) one or more times to add power spectral density values to the multiple power spectral density values; and (vii) obtaining a power spectral density of the device signal having at least some of the intermodulation interference from the frequency spectrum analyzing device removed by performing an optimization process that is based on the multiple power spectral density values. The example method may include one or more of the following features, either alone or in combination.

The optimization process may produce the power spectral density of the device signal and one or more, or all, of the following power densities: a first power spectral density based on the intermodulation interference produced by the frequency spectrum analyzing device; a second power spectral density based on the noise signal; and a third power spectral density based on an intermodulation correlation power associated with the device signal and the intermodulation interference of the frequency spectrum analyzing device. The power spectral density of the device signal may not include all or part of each of: the first power spectral density, the second power spectral density, or the third power spectral density. The power spectral density of the device signal may include an intermodulation component, such as intermodulation interference, from the DUT.

The optimization process may include the following operations: (viii) selecting a frequency value among multiple frequency values; (ix) performing an optimization using ones of the multiple power spectral density values associated with the selected frequency value; and (x) repeating operations (viii) and (ix) one or more times to obtain values for the power spectral density of the device signal.

The attenuation value may be set in a digital step attenuator (DSA). The DSA may be part of the frequency spectrum analyzing device. The DSA may be external to the frequency spectrum analyzing device. The DSA may be between the frequency spectrum analyzing device and the DUT.

Operations (i) to (vi) may be performed on a test instrument. Operation (vii) may be performed by one or more processing devices. Operations (i) to (vii) may be performed on a test instrument.

Each frequency value may correspond to a bin covering a span of multiple frequencies. The DUT may be, or include, network infrastructure equipment and the frequency spectrum analyzing device may be, or include, a vector signal analyzer.

An example system includes one or more apparatuses including a frequency spectrum analyzing device that produces a noise signal and intermodulation interference. The one or more apparatuses are configured to perform operations that include: (i) receiving a device signal from a device under test (DUT); (ii) setting an attenuation value; (iii) applying the attenuation value to the device signal to produce an attenuated device signal for a frequency spectrum analyzing device; (iv) obtaining a power spectral density value, where the power spectral density value includes a power, at a frequency value, of a combined signal that is based on the attenuated device signal, the noise signal, and the intermodulation interference; (v) repeating operations (ii), (iii), and (iv) one or more times to produce multiple power spectral density values; and (vi) repeating operations (i), (ii), (iii), (iv), and (v) one or more times to add power spectral density values to the multiple power spectral density values. The system may include one or more processing devices configured to perform operations that include (vii) obtaining a power spectral density of the device signal having at least some of the intermodulation interference from the frequency spectrum analyzing device removed by performing an optimization process that is based on the multiple power spectral density values. The example system may include one or more of the following features, either alone or in combination.

The optimization process may produce the power spectral density of the device signal and one or more, or all, of the following power densities: a first power spectral density based on the intermodulation interference produced by the frequency spectrum analyzing device; a second power spectral density based on the noise signal; and a third power spectral density based on an intermodulation correlation power associated with the device signal and the intermodulation signal of the frequency spectrum analyzing device. The power spectral density of the device signal does not include all or part of each of: the first power spectral density, the second power spectral density, or the third power spectral density. The power spectral density of the device signal may include an intermodulation component, such as intermodulation interference, from the DUT.

The optimization process may include the following operations: (viii) selecting a frequency value among multiple frequency values; (ix) performing an optimization using ones of the multiple power spectral density values associated with the selected frequency value; and (x) repeating operations (viii) and (ix) one or more times to obtain values for the power spectral density of the device signal.

The attenuation value may be set in a DSA. The DSA may be part of the frequency spectrum analyzing device. The DSA may be external to the frequency spectrum analyzing device. The DSA may be between the frequency spectrum analyzing device and the DUT.

The system may include a test instrument that includes the one or more apparatuses and the one or more processing devices. The system may include a test instrument that includes the one or more apparatuses and one or more computing devices that include the or more processing devices.

Each frequency value may corresponds to a bin covering a span of multiple frequencies. The DUT may include network infrastructure equipment and the frequency spectrum analyzing device comprises a vector signal analyzer.

Any two or more of the features described in this specification, including in this summary section, may be combined to form implementations not specifically described in this specification.

At least part of the apparatuses, devices, systems, and processes described in this specification may be configured or controlled by executing, on one or more processing devices, instructions that are stored on one or more non-transitory machine-readable storage media. Examples of non-transitory machine-readable storage media include read-only memory, an optical disk drive, memory disk drive, and random access memory. At least part of the apparatuses, devices, systems, and processes described in this specification may be configured or controlled using a computing system comprised of one or more processing devices and memory storing instructions that are executable by the one or more processing devices to perform various control operations. The apparatuses, devices, systems, and processes described in this specification may be configured, for example, through design, construction, composition, arrangement, placement, programming, operation, activation, deactivation, and/or control.

The details of one or more implementations are set forth in the accompanying drawings and the following description. Other features and advantages will be apparent from the description and drawings, and from the claims.

DESCRIPTION OF THE DRAWINGS

Like reference numerals in different Figures indicate like elements.

DETAILED DESCRIPTION

Figure 1:
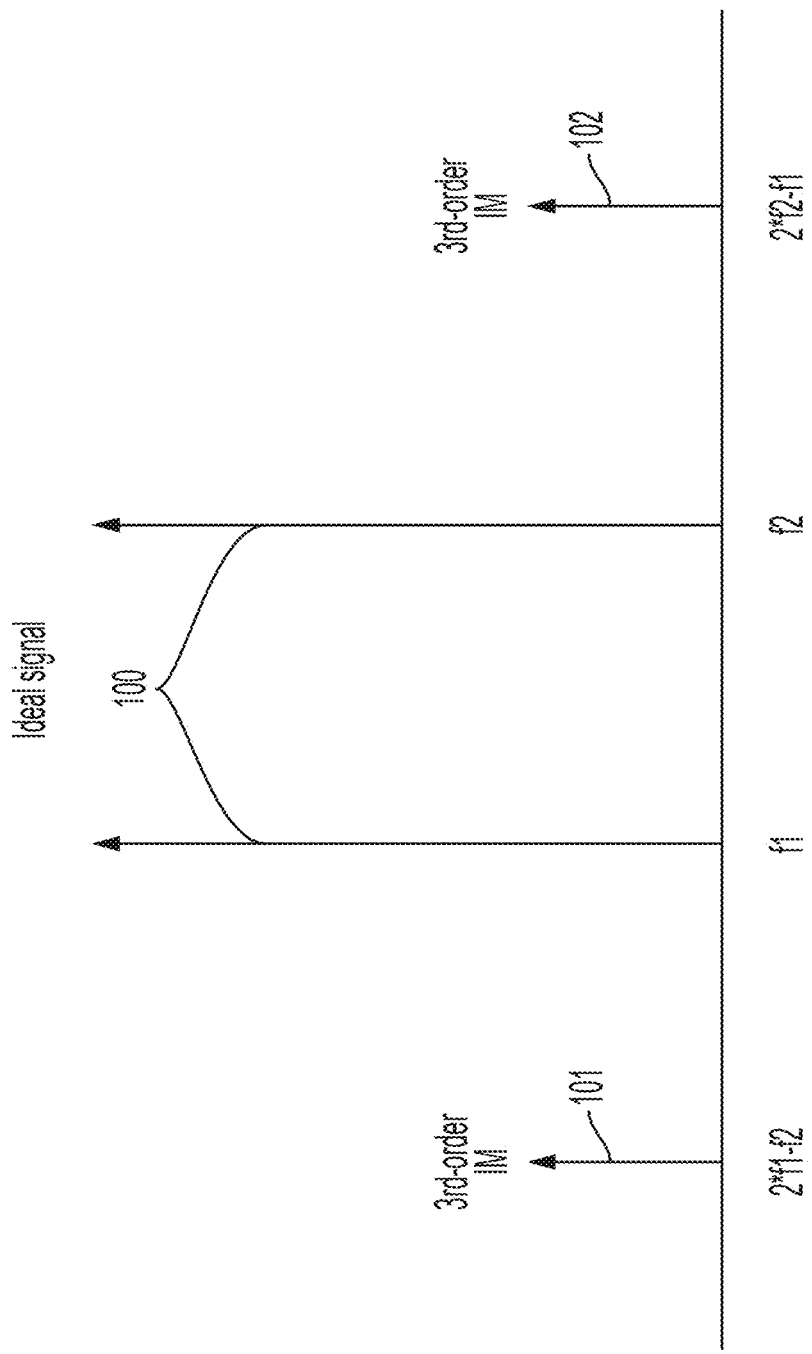
FIG. 1 is a graph showing an ideal signal at two frequencies and third order intermodulation interference (IM3) comprised of sidebands.

Described herein are example implementations of techniques for removing test equipment noise intermodulation (IM) interference and test equipment noise from power spectral density (PSD) measurements of a signal from a device under test (DUT) ("the DUT signal") to which the test equipment IM interference and test equipment noise have been added. The techniques are described in the context of removing IM interference and noise added by test equipment from measurements of a DUT signal obtained by a vector signal analyzer (VSA), which is a type of frequency spectrum analyzing device (e.g., a spectrum analyzer). However, the techniques may be used to remove IM interference and noise caused by test equipment from measurements of any type of radio frequency (RF) signal by any hardware used in test equipment for measuring any frequency spectrum, or other, signals including, but not limited to, other types of frequency spectrum analyzing devices, such as a direct sampling scope. The description herein focuses on removing third order intermodulation interference (IM3) from PSD measurements since that can be most problematic; however, the techniques also remove other orders of IM interference from the PSD measurements.

With respect to VSA intermodulation interference, the techniques described herein have advantages in that they remove at least some (e.g., all or less than all) IM interference, including IM3 interference, from PSD measurements of a DUT signal to which the test equipment IM interference and test equipment noise have been added.

With respect to VSA noise, the VSA's noise floor may be defined as the lowest power DUT signal that the VSA can measure due to noise added to the DUT signal by the VSA. When part of a DUT signal is near or below the VSA's noise floor, which can be the case for dynamic range signals, particularly signals having parts that are 50 decibels (dB), 60 dB, 70 dB or lower than the main part of the DUT signal, PSD measurements may be distorted by the VSA noise. The techniques described herein may have advantages in that they remove at least some of the VSA noise from the PSD measurements of the DUT signal containing test equipment noise, along with removing the IM interference from the PSD measurements, thereby enabling PSD measurements using legacy (e.g., older) VSAs that were not designed to produce noise levels that enable PSD measurements of low power parts of a signal.

Among the advantages of the example techniques are that they are dynamic. For example, removal of the IM interference and noise occurs during PSD measurements. As a result, the IM interference and the noise being removed is the actual IM interference and noise added to the DUT signal by the test equipment, which may result in more accurate PSD measurements by the VSA. Other advantages may be that the techniques can use existing test equipment, and do not require custom-designed test equipment or specific signals to remove the IM interference and noise.

The techniques described herein have general applicability, but may have particular applicability to infrastructure equipment such as base stations or micro stations. In this regard, an issue with infrastructure equipment is that noise from one frequency channel can be radiated into one or more other frequency channels. The processes described herein enable PSD measurements of the base station or micro station signals in the presence of VSA noise and IM interference.

Figure 2:
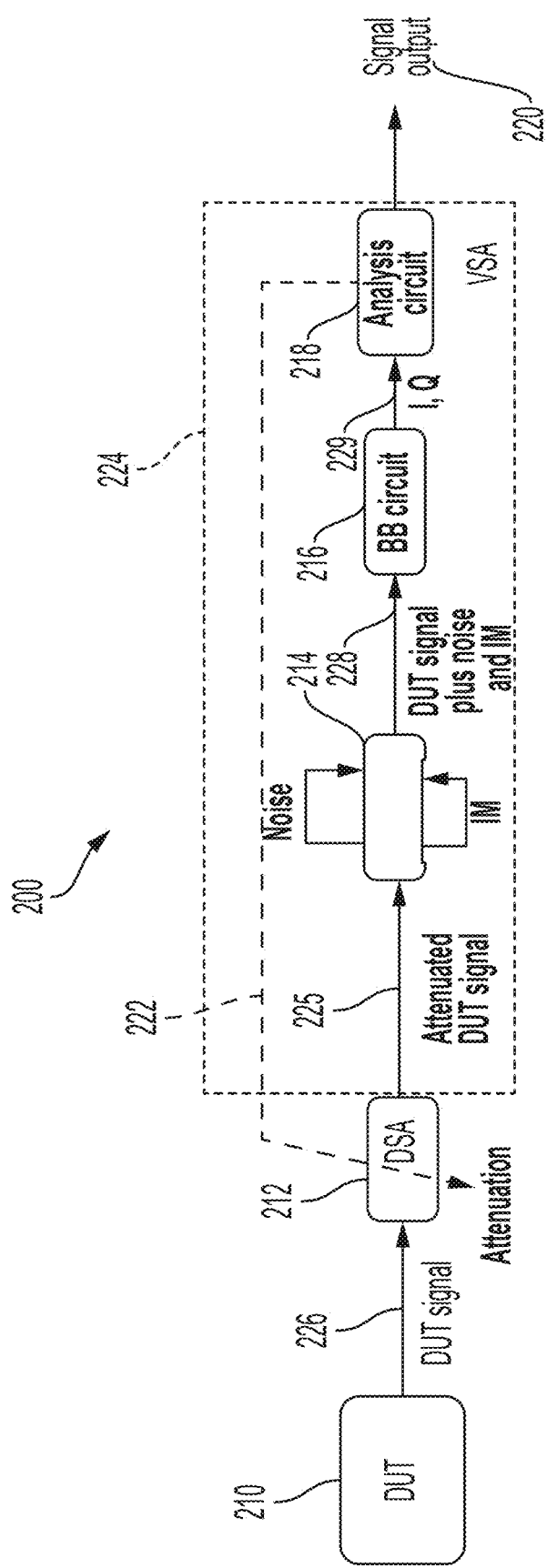
FIG. 2 is a block diagram of a model of example hardware configured to remove test equipment intermodulation interference (IM) and test equipment noise from power spectral density (PSD) measurements of a signal from a device under test (DUT) to which the test equipment IM and test equipment noise have been added.

FIG. 2 is a block diagram of a model of an example system 200 on which the example techniques described herein may be implemented. System 200 is, or is part of, test equipment that is configured to test DUT 210 by measuring signals from the DUT. DUT 210 may be any appropriate type of electronic device, examples of which include, but are not limited to, infrastructure equipment such as the devices described above.

System 200 includes digital step attenuator (DSA) 212. DSA 212 is a hardware device that is configured to apply a controlled amount of attenuation to a signal, such as a high frequency radio frequency (RF) DUT signal, e.g., without adding noise. Signal attenuation includes the reduction or loss of communication signal strength during transmission. The amount of attenuation that can be applied by DSA 212 is digitally controlled, e.g., by analysis circuit 218 described below. The attenuation applied by DSA 212 may be applied in steps to signals from DUT 210. In some implementations, the steps may be on the order of ½ dB, although other step sizes such as ¼ dB, ¾ dB, or 2 dB may be used. In some implementations, the attenuation is applied to each DUT signal over a range of 2 dB to 3 dB; however, these ranges may be different for different DUTs and different configurations of test equipment. For example, the ranges may be from 0.5 dB to 2.5 dB, from 2 dB to 6 dB, and so forth. The variation on the range depends on number of measurements needed to implement the techniques described herein for removing IM interference and test equipment noise from PDS measurements. For example, for a very low power signal component, 20 to 40 measurements at two or more attenuation steps, may be used. For a higher power signal component, measurements at less than 20 attenuation steps may be used, resulting in a corresponding number of measurements per signal, may be used.

In some implementations, DSA 212 is part of/internal to the VSA 224. In this example, the DSA 212 and the VSA 224 are part of the same apparatus. In some implementations, the DSA is not part of/external to the VSA, as shown in FIG. 2. In this example, the DSA 212 and the VSA 224 different apparatus. In both examples, the DSA is between the DUT 210 and an analysis circuit 218 of the VSA.

In this example, DSA 212 is configured to receive a signal 226 from DUT 210. The DUT signal may be a high-speed signal—for example, a signal having frequencies in the GHz range—although any type of signals, including low frequency signals, may be received. Signal 226 may be an RF signal having parts (also referred to as components or portions) thereof that are at relatively low power, such as described above. Signal 226 may include DUT noise and DUT IM interference, which should not be removed from PSD measurements by the techniques described herein. DSA 212 is configured to apply an attenuation value (e.g., a step value) to the DUT signal to produce an attenuated DUT signal 225.

VSA 224 is a hardware device that is configured to perform PSD measurements based on the attenuated DUT signal 225. In this example, VSA 224 is noisy. Noise from the VSA is added to the attenuated DUT signal 225. This noise is represented conceptually by block 214. Note that block 214 is not an actual device or component of VSA 224, but rather just a physical representation of the VSA noise. The amount of noise added to attenuated DUT signal 225 is based on the type of VSA used. In some implementations, the power of the noise added is greater than the power of parts of the attenuated DUT signal 225. In some implementations, the power of the noise added is less than the power of parts of the attenuated DUT signal 225. The relationship between the noise added and the attenuated DUT signal 225 DUT signal may vary based on the amount of attenuation applied to the original DUT signal 226. The VSA noise may remain constant over a small attenuator range. The DUT signal may vary (e.g., increase and/or decrease in amplitude) with variations in the attenuation.

As noted above, both DUT 210 and VSA 224 may generate IM interference. The techniques described herein also remove the VSA-generated IM interference (in addition to VSA noise) from PSD measurements of the DUT signal. In this regard, the IM interference from the VSA is added to the attenuated DUT signal 225. This IM interference is also represented conceptually by block 214. As noted, block 214 is not an actual device or component of VSA 224, but rather just a physical representation of the IM interference. The amount of IM interference added to attenuated DUT signal 225 is based on the type of VSA used. In some implementations, the power of the IM interference added is greater than the power of parts of the attenuated DUT signal 225. In some implementations, the power of the IM interference added is less than the power of parts of the attenuated DUT signal 225. The relationship between the IM interference added and the attenuated DUT signal 225 DUT signal seen by the VSA will vary based on the amount of attenuation applied to the original DUT signal 225.

Baseband (BB) circuit 216 is configured to receive the attenuated DUT signal plus noise and IM interference 228. BB circuit 216 may be a baseband processor that is configured to synthesize a digitized baseband representation of the on signal 228. Specifically, to transmit a signal, the signal may be compiled into the digitized baseband representation, such as in-phase (I) and quadrature (Q) samples. These components, which are the digitized baseband representation 229, are the output of BB circuit 216.

Analysis circuit 218 may be, or include, one or more processing devices, such as one or more controllers or one or more microprocessors as described herein. In some implementations, analysis circuit 218 is configured—for example, programmed—to perform the operations described herein for removing at least some (e.g., all or less than all) of the VSA IM interference and the VSA noise from a PSD measurement of signal 228 based on the digitized baseband representation thereof. In some implementations, analysis circuit 220 is configured to provide, to one or more external computing devices, data used to perform the operations described herein for removing at least some of the VSA IM interference and the VSA noise from the PSD measurement.

Figure 3:
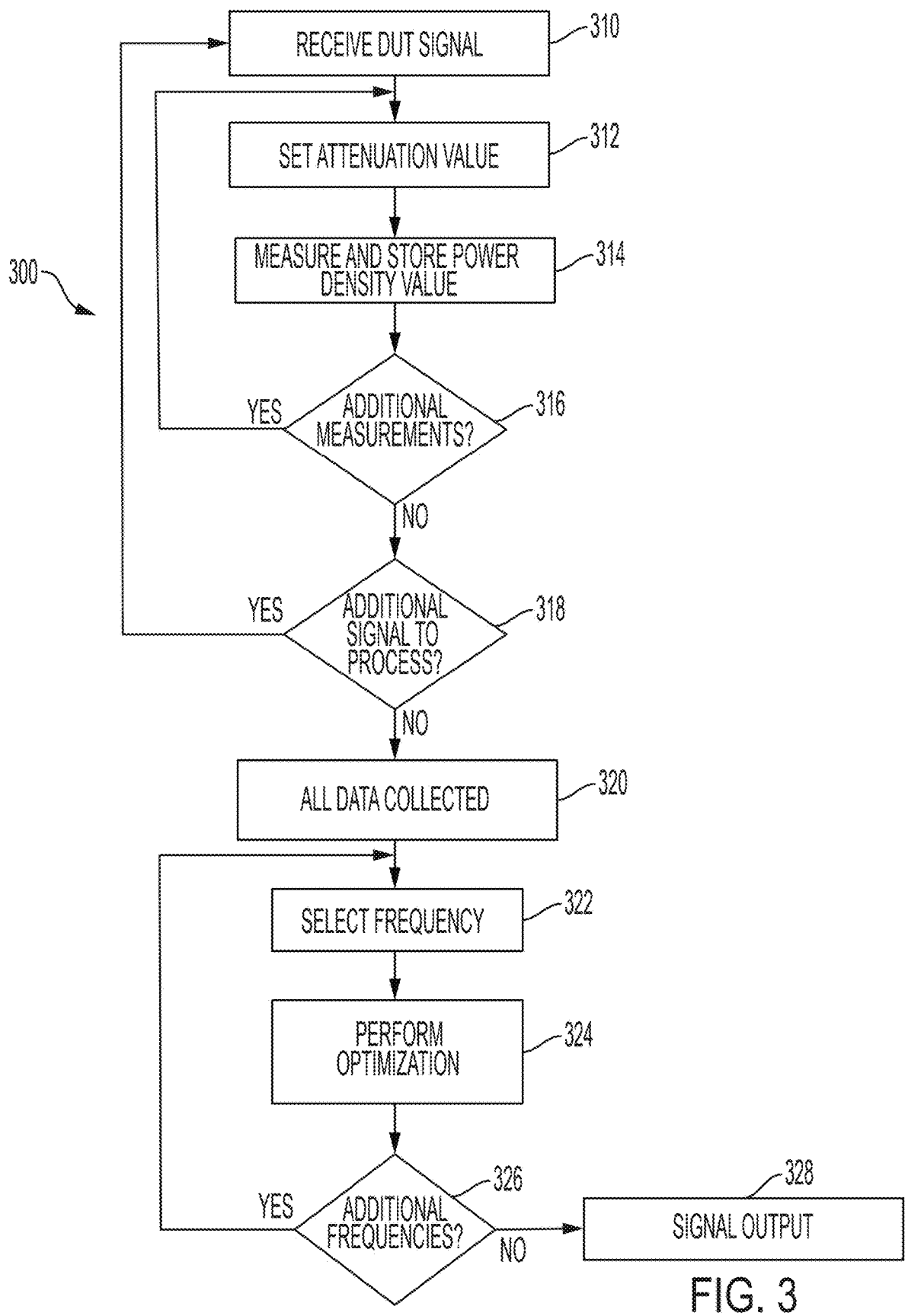
FIG. 3 is a flowchart showing operations included in an example process for removing test equipment IM interference and test equipment noise from PSD measurements of a DUT signal to which the test equipment IM and the test equipment noise have been added.

FIG. 3 shows operations included in an example process 300 for removing all or some of the VSA IM interference and the VSA noise from the PSD measurement of a DUT signal to which the VSA IM interference and the VSA noise have been added. Process 300 includes operations 310 to 320 for collecting data based on actual PSD measurements of one or more such DUT signals for different DSA attenuation values, and operations 322 to 326 for performing an optimization process to remove all or some (e.g., at least some) of the VSA IM interference and the VSA noise from the PSD measurement of such a DUT signal.

According to example process 300, DSA 212 receives (310) a signal from a DUT, such as DUT 210 of FIG. 2. In some implementations, the signal may include a low power, high frequency component of an RF signal—for example, a portion of the RF signal having a frequency in the GHz range and having a power of 50 dB or less, 60 dB or less, and so forth relative to the main portion of the RF signal. An attenuation value is set in, e.g., programmed into, DSA 212. This may be done, for example, by analysis circuit 218 based on a number of PSD measurements to be obtained by the VSA. For example, if greater numbers of PSD measurements are to be obtained, then the attenuation value and steps thereof may be set relatively low, for example, on the order of ½ dB step size over a range of 2 dB to 3 dB, whereas if fewer numbers of PSD measurements are to be obtained, the attenuation step size may be set to a higher value. The step size and the range may be varied to obtain any desired number of PSD measurements. Many different attenuator settings may be used and multiple measurements may be repeated at any given attenuator setting. In a particular non-limiting example, five attenuator settings may be used to obtain two measurements per attenuator setting.

As explained previously, the VSA introduces both VSA IM interference and VSA noise into the attenuated DUT signal 225, resulting in signal 228 (FIG. 2). Thereafter, the resulting signal 228 containing VSA IM interference and VSA noise is synthesized into a digitized baseband representation by BB circuit 216. Analysis circuit 218 measures (314) the PSD of signal 228 using the digitized baseband representation 229. The resulting PSD value(s) are stored in memory. The values constitute individual PSD values measured in dBm (decibel-milliwatts), each measured at a resolution bandwidth (RBW). The RBW is the frequency step size, at which the PSD measurements are measured. The values may be stored in bins in the memory, with each bin corresponding to an RBW.

Process 300 determines (316) whether there are additional measurements to obtain for the current DUT signal 226. Whether additional measurements are to be obtained is based on whether, statistically, there are enough measurements to determine the VSA noise and the VSA IM interference. This determination may also based on the step size and the range over which the PSD values are measured. For example, if the step size is ½ dB, the range is from 2 dB to 3 dB, and the current value in the range is 2.5 dB, then there are additional attenuation values to process. Conversely, if the current value in the range is 3 dB, then there are no additional attenuation values to process for the current DUT signal. Operations 312 to 316 may be repeated until all enough measurements have been obtained.

Process 300 determines (318) whether there are additional DUT signals to process. The number of DUT signals to process may be programmed into the analysis circuit 218 or a control system for the test equipment (described below). Greater numbers of signals processed produce additional data. The more data that is processed, the greater the accuracy that the techniques described herein may be for removing VSA IM interference and VSA noise from a DUT signal to which the VSA IM interference and the VSA noise have been added, at least in some implementations. Operations 310 to 318 may be repeated until all DUT signals have been processed.

If all DUT signals have been processed (318) for all attenuations, then all data has been collected (320) for this example of removing VSA IM interference and VSA noise from PSD measurement of a DUT signal to which the VSA IM interference and the VSA noise have been added.

Process 300 then performs an optimization process based on the collected data (320) in order to determine the PSD of the DUT signal to which the VSA IM interference and the VSA noise have been added across frequencies spanning the frequency bins described above. Process 300 selects (322) a frequency, f, and performs the optimization (324) to obtain a PSD value for the frequency, f. In some implementations, the optimization is, or includes, a regression optimization; however, other types of optimizations or processes may be used. An example optimization that may be performed in operation 324 is described as follows.

The measured IM3 power $P_{IM,f}(A)$ of a DUT signal $x_{DUT}$ at frequency f attenuated based on a scaling factor A is a combination of the DUT IM3 interference ($x_{DUT,IM3,f}(t)$) and VSA IM3 interference ($x_{VSA,IM3,f}(t)$), which can be expressed as follows.

$$P_{IM,f}(A) = \int_t \left(A^{1/2} x_{DUT,IM3,f}(t) + A^{3/2} x_{VSA,IM3,f}(t)\right)^2 \quad (1)$$

$$= A \int_t x^2_{DUT,IM3,f}(t) + A^3 \int_t x^2_{VSA,IM3,f}(t) +$$

$$A^2 \int_t 2 x_{DUT,IM3,f}(t) x_{VSA,IM3,f}(t)$$

$$= A P_{DUT,IM3,f} + A^3 P_{VSA,IM3,f} + A^2 P_{CORR,IM3,f}$$

$$= A P_{DUT,IM3,f} + A^3 P_{VSA,IM3,f} + 2 A^2 \lambda (P_{DUT,IM2,f} P_{VSA,IM3,f})^{1/2}$$

In equation (1), above, A is a scaling factor that produces a level of attenuation (e.g., where A being 1 means no attenuation and A being 0 means complete attenuation), $P_{DUT,IM3,f}$ is the power of the DUT IM3 interference at frequency f; $P_{VSA,IM3,f}$ is the power of the VSA IM3 interference at frequency f; $P_{CORR,IM3,f}$ is the correlation of the DUT IM3 interference and the VSA IM3 interference at frequency f; and λ is a coefficient resulting from the phase difference (Δ) between the VSA IM3 interference and the DUT IM3 interference, which is within [−1,+1]. When the phase difference between the DUT IM3 interference and the VSA IM3 interference is 0, λ is 1; and when the phase difference between the DUT IM3 interference and the VSA IM3 interference is π, λ is −1. $P_{CORR,IM3,f}$ has the following constraint.

$$P^2_{CORR,IM3,f} = 4\lambda^2 P_{DUT,IM3,f} P_{FSA,IM3,f} \leq 4 P_{DUT,IM3,f} P_{VSA,IM3,f}$$

The VSA noise and the DUT signal at frequency f, we will have an overall power $P_f(A)$ at frequency f defined as follows.

$$P_f(A) = \qquad (2)$$
$$P_{VSA,N,f} + A(P_{DUT,f} + P_{DUT,IM3,f}) + A^3 P_{VSA,IM3,f} + A^2 P_{CORR,IM3,f}$$

Equation (2) can be rewritten as follows, replacing the terms with "x"

$$P_f(A) = x_0 + Ax_1 + A^2 x_2 + A^3 x_3 \qquad (3)$$

Equation (2) has the following constraint.

$$x_0 \geq 0, \ x_1 \geq 0, \ x_3 \geq 0, \ x_2^2 \leq 4 x_1 x_3 \qquad (4)$$

In equations (2) and (3), the following applies:
  $x_0$ ($P_{VSA,N,f}$) is the power of the VSA noise at frequency f
  $x_1$ ($P_{DUT,f}+P_{DUT,IM3,f}$) is the power of the DUT signal containing the DUT's own noise and IM interference, e.g., a transmitted power signal of the DUT including an ideal DUT signal and any noise and IM interference ($P_{DUT,IM3,f}$) introduced into the ideal DUT signal by the DUT it self at frequency f; $x_1$ ($P_{DUT,f}+P_{DUT,IM3,f}$) contains no VSA IM interference or VSA noise
  $x_2$ ($P_{VSA,IM3,f}$) is the power of the VSA IM3 at frequency f
  $x_3$ ($P_{CORR,IM3,f}$) is the power of the correlation of the DUT IM3 interference and the VSA IM3 interference at frequency f
$x_1$ is a signal that is to be obtained and output in operation 328 of FIG. 2. However, any one or more (e.g., all) of $x_0$, $x_1$, $x_2$, and/or $x_3$ may be output in operation 328 of FIG. 2.

Using the mathematical model of equations (2) and (3), an optimization, such as a regression optimization, is performed (324) on the measured power data instances at different attenuations, to disassemble the power, $P_f(A)$, into each component $x_0$, $x_1$, $x_2$, and $x_3$ of equations (2) and (3). Using the data that has been collected (320)—referred to as the real measurement data instances. $\hat{P}_{f,A}$—the regression optimization problem can be constructed as follows for the frequency, f, with the same constraints as in equation (4) above.

$$\min_{x0,x1,x2,x3} \sum_{\hat{P}_{f,A}} (P_f(A) - \hat{P}_{f,A})^2 \qquad (5)$$

In equation (5) above, $P_f(A)$ is the PSD of the DUT signal having the VSA noise and VSA IM interference at frequency f for attenuation A determined mathematically by equations (2)/(3) above, and $\hat{P}_{f,A}$ are the PSD values that have been collected and stored in operations 310 to 320 above. The optimization of equation (5) can be solved at frequency, f, using a linear analytical solution. The optimization uses the function shown above to minimize a difference between $P_f(A)$ and $\hat{P}_{f,A}$. In particular, the optimization uses the function of equation (5) to minimize a difference between $P(A)$ and $\hat{P}_{f,A}$. The output of the optimization of equation (5) is each component $x_0$, $x_1$, $x_2$, and $x_3$ of equations (2) and (3).

Thereafter, if a new frequency among the frequency bins is to be selected (326), for example if all $\hat{P}_{f,A}$ data for all frequency bins has not been processed, processing returns to operation 322. Frequency selection (322) and optimization (324) may be repeated one or more times to remove all or some VSA IM interference and VSA noise from the PSD measurements of each DUT signal over a frequency range that spans the frequency bins. The resulting is that $x_0$, $x_1$, $x_2$, and $x_3$ may be obtained over multiple frequencies. In some implementations, only $x_1$ is output at operation 328. In some implementations, $x_0$ and/or $x_1$ and/or $x_2$ and/or $x_3$ is/are output at operation 328.

Figure 4:
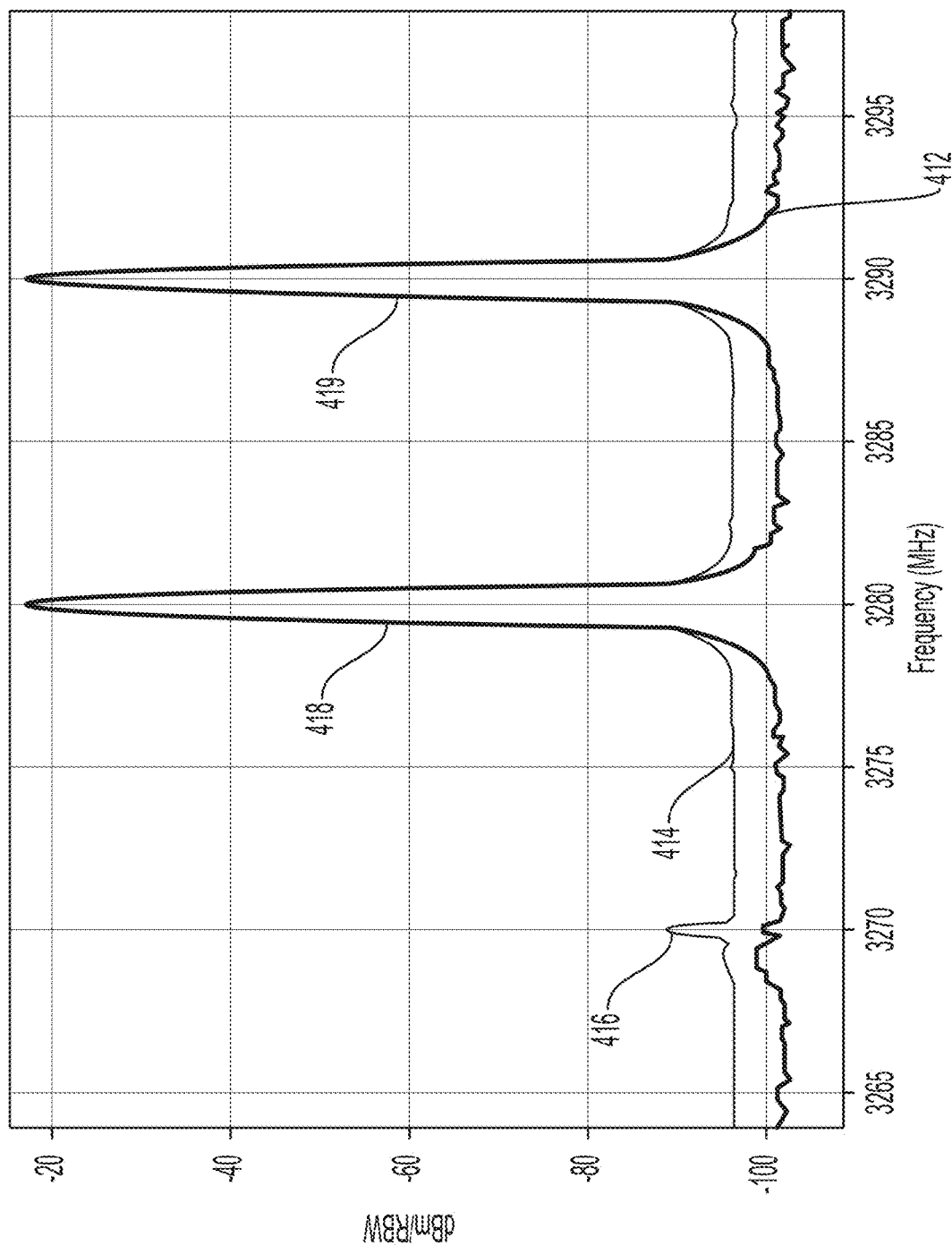
FIG. 4 is a graph showing a comparison of example PSD measurements for a DUT signal to which the test equipment IM3 and test equipment noise have been added superimposed on the PSD measurements for the same DUT signal having the test equipment IM3 interference and the noise removed using the example process of FIG. 3

FIG. 4 is a plot of signal power measured in dBm (decibel-milliwatts) that superimposes a DUT signal measurement 414 containing IM3 interference 416 from the VSA on a DUT signal measurement 412 having the IM3 interference removed according to process 300. More specifically, FIG. 4 shows a two tone 418, 419 PSD measurement. Compared to measurement 414, in measurement 412, all or part of the IM3 interference 416 at power at 3270 megahertz (MHz) is removed, while still maintaining the integrity of tones 418, 419.

Figure 5:
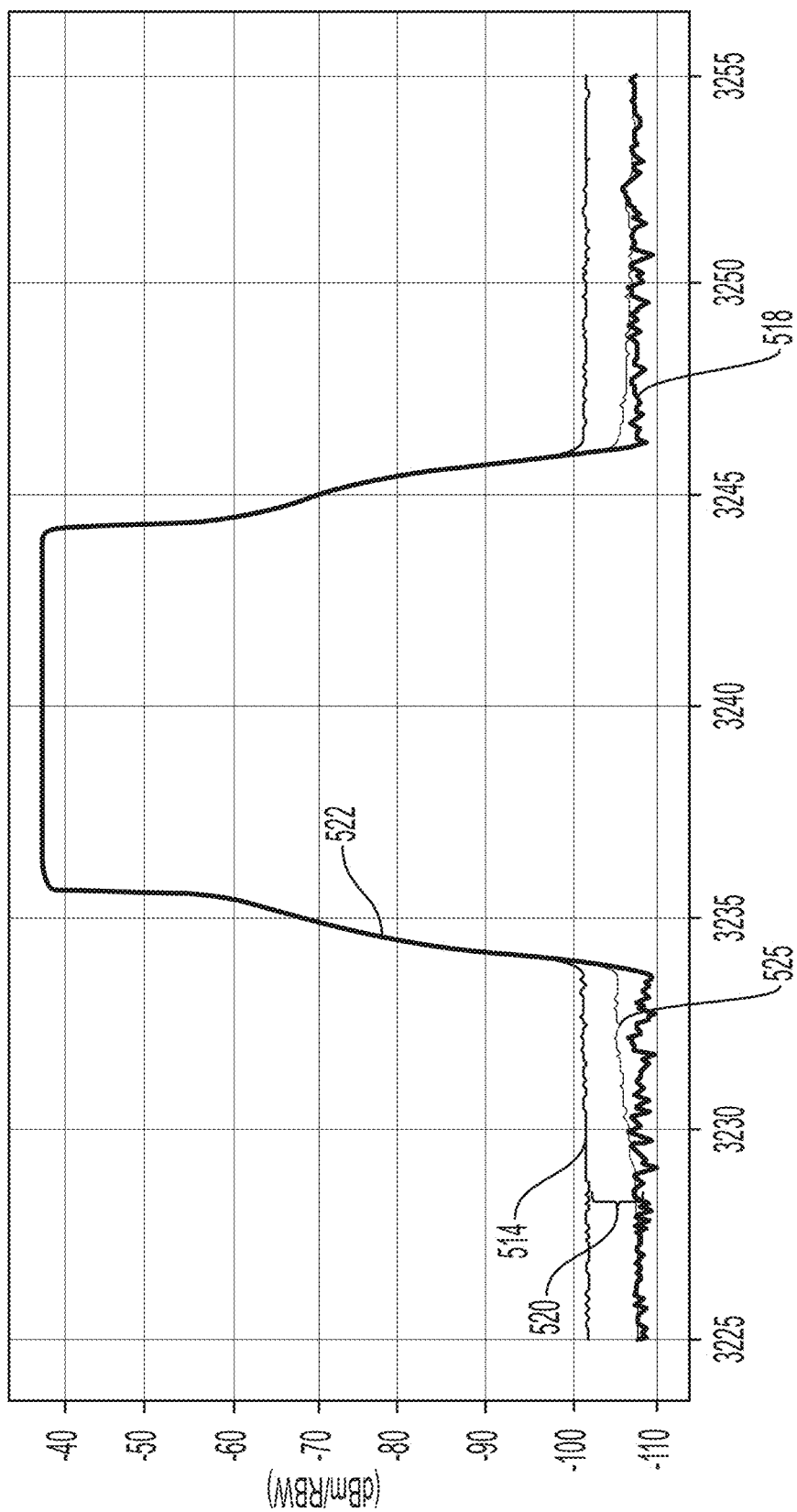
FIG. 5 is a graph showing a comparison of example PSD measurements for a DUT signal to which the test equipment IM and test equipment noise have been added superimposed on the PSD measurements for the same DUT signal having the test equipment IM3 interference and noise removed using the example process of FIG. 3
Figure 6:
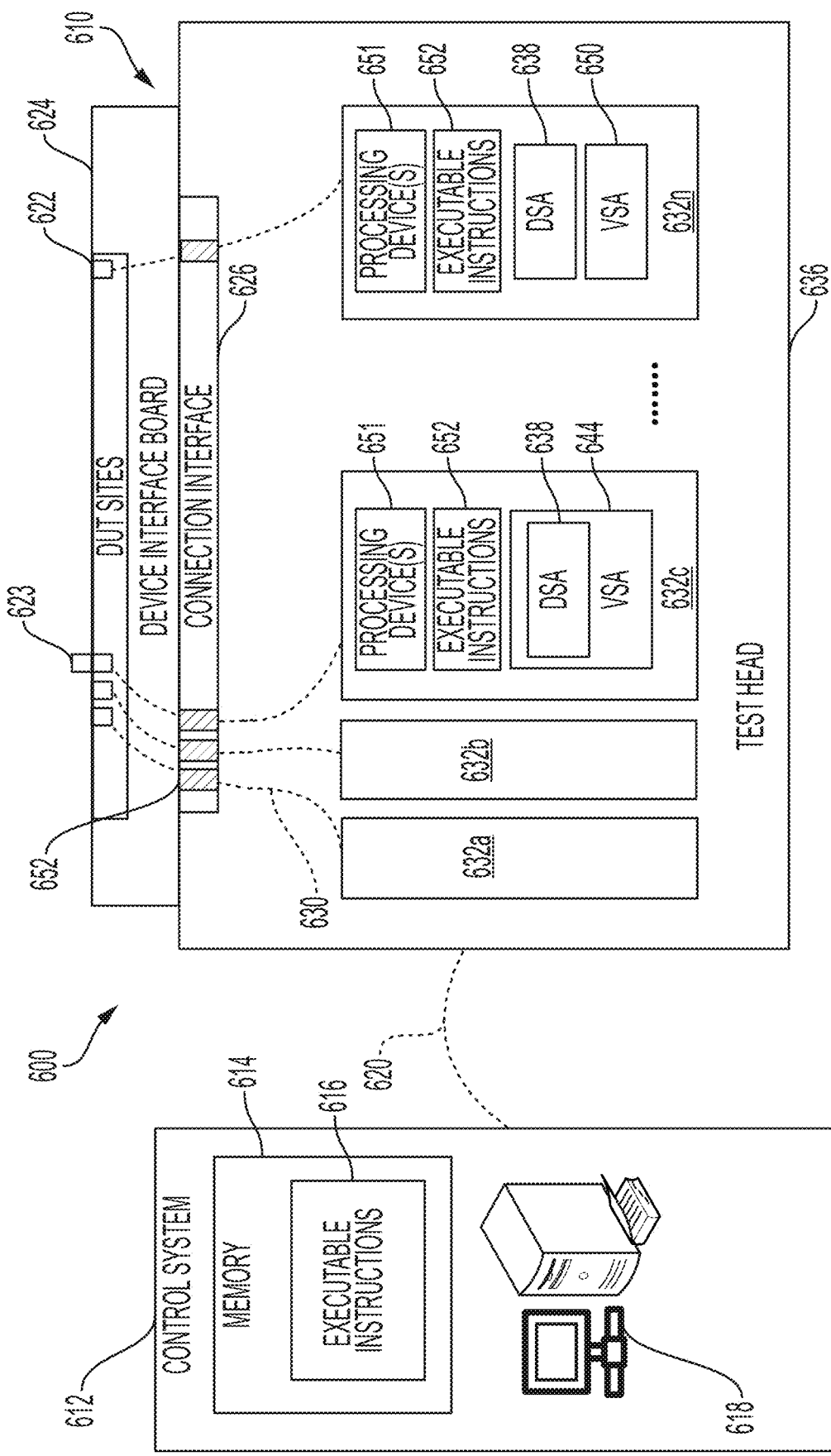
FIG. 6 is a block diagram showing components of an example test system on which the apparatuses, devices, systems, and processes described herein may be implemented.

FIG. 5 is a plot showing a comparison of a modulated DUT PSD signal measurement 518 having the VSA IM3 interference and VSA noise removed by process 300 of FIG. 3, superimposed on the same modulated DUT PSD signal measurement 514 without the VSA IM3 interference and VSA noise removed. The two PSD measurements are plotted over a frequency range 512 of slightly below 3100 megahertz (MHz) to over about 3300 MHz. As shown, process 300 reduces or removes noise 520. The plot also shows the resulting PSD signal if only noise was removed (525). As can be seen, close to the main signal 522, the IM3 of the VSA artificially increases the DUT PSD signal FIG. 6 is a block diagram showing components of automatic test equipment (ATE) 600 on which the systems and processes described herein may be implemented. ATE 600 that includes a testing device ("tester") 610 and a control system 612. ATE 600 may be, or include, an implementation of test equipment 200 of FIG. 2.

Tester 610 includes a test head 636 and a device interface board (DIB) 624 connected physically and electrically to test head 610. In this example, DIB 624 includes a circuit board that includes mechanical and electrical interfaces at sites 622. One or more DUTs, such as DUT 623 which may be an example of DUT 210 (FIG. 2), connect to each of those sites for testing by the ATE. DIB 624 may include, among other things, connectors, conductive traces, conductive layers, and circuitry for routing signals between test instruments in the test head 610, DUTs connected to DIB sites, and other circuitry in the ATE. Power, including voltage, may be run via one or more layers in the DIB to DUTs connected to the DIB.

Test head 610 includes multiple test instruments 632a to 632n, each of which may be configured, as appropriate, to implement testing and/or other functions. Although only four test instruments are shown, ATE 600 may include any appropriate number of test instruments, including one or more residing outside of test head 610. The test instruments may be hardware devices that may include one or more processing devices and/or other circuitry. The test instruments may be configured—for example, programmed—to output commands to test DUTs held on the DIB. The commands to test the DUTs may be or include instructions, signals, data, parameters, variables, test patterns, and/or any other information designed to elicit response(s) from the DUT. Commands to test a DUT may be generated by executing or interpreting, on a test instrument, test program(s) received by ATE 600 from an external system. In an example, a test program may be or include a set of commands that are executed or interpreted to produce commands that the test instrument uses to test the DUT.

One or more—for example, all of—the test instruments may be configured to receive, from the DUT, responses to the commands sent from the test instruments to the DUT. The responses may include the DUT signals 226 described herein with respect to FIG. 2, which contain DUT noise and DUT IM interference. The test instruments may be configured to perform measurements on the DUT signals to determine, among other things, spectrum measurements, such as PSD measurements using the techniques described herein with respect to FIGS. 2 to 5 to remove all or some VSA IM3 interference and all or some VSA noise from the PSD measurement of a DUT signal to which the VSA IM interference and the VSA noise have been added, such as signal 228 of FIG. 2.

To this end, each test instrument may include one or more processing devices 651, examples of which are described herein, and memory storing machine-executable instructions 652 that are executable by the processing device(s) to implement the VSA IM3 interference and VSA noise removal and data collection operations of process 300. Processing device(s) 651 may be implementations of the analysis circuit 218 of FIG. 2.

Each test instrument may also include the hardware of FIG. 2, including a DSA, a VSA, and a baseband circuitry (not shown). In this regard, In the example of FIG. 6, test instrument 632c includes a DSA 638, which may be an implementation of DSA 212 of FIG. 2, inside VSA 644. In the example of FIG. 4, test instrument 632n includes a DSA 638, which may be an implementation of DSA 212 of FIG. 2, outside VSA 650 as in FIG. 2. VSAs and DSAs may also be present in either configuration in test instruments 632a and 632b for performing the techniques described herein to remove all or some VSA IM3 interference and VSA noise from the PSD measurement of a DUT signal to which VSA IM interference and VSA noise have been added.

Individual ones to the test instruments may be configured to perform the techniques described herein to remove all or some VSA IM3 interference and VSA noise from the PSD measurement of a DUT signal to which VSA IM interference and VSA noise have been added, or two or more the test instruments may be configured to operate together to perform the techniques described herein to remove all or some VSA IM3 interference and VSA noise from the PSD measurement of a DUT signal to which VSA IM interference and VSA noise have been added. In some implementations, the data to perform the techniques, such as, described above, may be obtained by a test instrument or multiple test instruments and then sent to a control system 612 (described below) to perform the optimization used to remove all or some VSA IM3 interference and all or some VSA noise from the PSD measurement of a DUT to which VSA IM interference and VSA noise have been added, as described with respect to equations (1) to (5) above. In some implementations, processing to perform the techniques described herein to remove all or some VSA IM3 interference and all or some VSA noise from the PSD measurement of a DUT signal to which VSA IM interference and VSA noise have been added may be distributed across two or more test instruments and/or the control system.

Test channels 630 are configured between the test head 636 and the DIB 624 to enable communication between the DUTs and the test instruments A connection interface board 626 may route those signals.

Control system 612 is configured—e.g., programmed to—to communicate with test instruments 632a to 632n to direct and/or to control testing of the DUTs. In some implementations, this communication 620 may be over a computer network or via a direct connection such as a computer bus or an optical medium. In some implementations, the computer network may be or include a local area network (LAN) or a wide area network (WAN). The control system may be or include a computing system comprised of one or more processing devices 618 (e.g., microprocessor(s)) and memory 614 for storage. Control system 612 may be configured to provide test programs and/or commands to test instruments 632a to 632n in the test head, which the test instrument(s) use to test the DUT. Control system 612 may be configured—e.g., programmed—to perform the optimization used to remove all or some VSA IM3 interference and all or some VSA noise from the PSD measurement of a DUT signal to which VSA IM interference and VSA noise have been added, as described with respect to equations (1) to (5) above. In particular, control system 612 may be configured to receive data, such as $\hat{P}_{f,A}$, from the test instruments and to perform the optimization used to remove all or some VSA IM3 interference and all or some VSA noise from the PSD measurement of a DUT signal to which VSA IM interference and VSA noise have been added, e.g., as described with respect to equations (1) to (5) above.

In some implementations, control system 312 may be configured—e.g., programmed—to receive PSD measurements of a DUT signal (to which VSA IM interference and VSA noise have been added) having the VSA IM3 interference and VSA noise removed (e.g., signal 220 of FIG. 2) by one or more test instrument(s) and to process the measurements to determine whether the DUT has passed or failed testing.

All or part of the apparatuses, devices, systems, and processes described herein including but not limited to system 200 and process 300, and their various modifications may be configured and/or controlled at least in part by one or more processing devices using one or more computer programs tangibly embodied in one or more information carriers, such as in one or more non-transitory machine-readable storage media. Examples of processing devices include, but are not limited to, computing devices, microprocessors, and the special purpose logic circuitry described below.

A computer program can be written in any form of programming language, including compiled or interpreted languages, and it can be deployed in any form, including as a stand-alone program or as a module, part, subroutine, or other unit suitable for use in a computing environment. A computer program can be deployed to be executed on one computer or on multiple computers at one site or distributed across multiple sites and interconnected by a network.

Actions associated with configuring or controlling the apparatuses, devices, systems, and processes described herein can be performed by one or more programmable processors executing one or more computer programs to control or to perform all or some of the operations described herein. All or part of the test systems and processes can be configured or controlled by special purpose logic circuitry, such as, an FPGA (field programmable gate array) and/or an ASIC (application-specific integrated circuit) or embedded microprocessor(s) localized to the instrument hardware.

Processors suitable for the execution of a computer program include, by way of example, both general and special purpose microprocessors, and any one or more processors of any kind of digital computer. Generally, a processor will receive instructions and data from a read-only storage area or a random access storage area or both. Elements of a computer include one or more processors for executing instructions and one or more storage area devices for storing instructions and data. Generally, a computer will also include, or be operatively coupled to receive data from, or transfer data to, or both, one or more machine-readable storage media, such as mass storage devices for storing data, such as magnetic, magneto-optical disks, or optical disks. Non-transitory machine-readable storage media suitable for embodying computer program instructions and data include all forms of non-volatile storage area, including by way of example, semiconductor storage area devices, such as EPROM (erasable programmable read-only memory), EEPROM (electrically erasable programmable read-only memory), and flash storage area devices; magnetic disks, such as internal hard disks or removable disks; magneto-optical disks; and CD-ROM (compact disc read-only memory) and DVD-ROM (digital versatile disc read-only memory).

Elements of different implementations described may be combined to form other implementations not specifically set forth previously. Elements may be left out of the systems described previously without adversely affecting their operation or the operation of the system in general. Furthermore, various separate elements may be combined into one or more individual elements to perform the functions described in this specification.

Other implementations not specifically described in this specification are also within the scope of the following claims.

What is claimed is:

1. A method comprising the following operations:
   (i) receiving a device signal from a device under test (DUT);
   (ii) setting an attenuation value;
   (iii) applying the attenuation value to attenuate the device signal for input to a frequency spectrum analyzing device, the frequency spectrum analyzing device producing a noise signal and intermodulation interference that are added to the device signal;
   (iv) obtaining a power spectral density value, where the power spectral density value comprises a power, at a frequency value, of a combined signal that is based on the device signal, the noise signal, and the intermodulation interference;
   (v) repeating operations (ii), (iii), and (iv) one or more times to produce multiple power spectral density values;
   (vi) repeating operations (i), (ii), (iii), (iv), and (v) one or more times to add power spectral density values to the multiple power spectral density values; and
   (vii) obtaining a power spectral density of the device signal having at least some of the intermodulation interference from the frequency spectrum analyzing device removed by performing an optimization process that is based on the multiple power spectral density values.

2. The method of claim 1, wherein the optimization process produces the power spectral density of the device signal and the following power densities:
   a first power spectral density based on the intermodulation interference produced by the frequency spectrum analyzing device;
   a second power spectral density based on the noise signal; and
   a third power spectral density based on an intermodulation correlation power associated with the device signal and the intermodulation interference of the frequency spectrum analyzing device.

3. The method of claim 2, wherein the power spectral density of the device signal does not include all or part of each of: the first power spectral density, the second power spectral density, or the third power spectral density.

4. The method of claim 3, wherein the power spectral density of the device signal comprises an intermodulation component from the DUT.

5. The method of claim 1, wherein the optimization process comprises the following operations:
   (viii) selecting a frequency value among multiple frequency values;
   (ix) performing an optimization using ones of the multiple power spectral density values associated with the selected frequency value; and
   (x) repeating operations (viii) and (ix) one or more times to obtain values for the power spectral density of the device signal.

6. The method of claim 1, wherein the attenuation value is set in a digital step attenuator (DSA), the DSA being part of the frequency spectrum analyzing device.

7. The method of claim 1, wherein the attenuation value is set in a digital step attenuator (DSA), the DSA being external to the frequency spectrum analyzing device.

8. The method of claim 1, wherein the attenuation value is set in a digital step attenuator (DSA), the DSA being between the frequency spectrum analyzing device and the DUT.

9. The method of claim 1, wherein operations (i) to (vi) are performed on a test instrument; and
   wherein operation (vii) is performed by one or more processing devices.

10. The method of claim 1, wherein operations (i) to (vii) are performed on a test instrument.

11. The method of claim 1, wherein each frequency value corresponds to a bin covering a span of multiple frequencies.

12. The method of claim 1, wherein the DUT comprises network infrastructure equipment and the frequency spectrum analyzing device comprises a vector signal analyzer.

13. A system comprising:
   one or more apparatuses comprising a frequency spectrum analyzing device, the one or more apparatuses being configured to perform operations comprising:
   (i) receiving a device signal from a device under test (DUT);
   (ii) setting an attenuation value;

(iii) applying the attenuation value to the device signal to attenuate the device signal for input to the frequency spectrum analyzing device, the frequency spectrum analyzing device producing a noise signal and intermodulation interference that are added to the device signal;

(iv) obtaining a power spectral density value, where the power spectral density value comprises a power, at a frequency value, of a combined signal that is based on the attenuated device signal, the noise signal, and the intermodulation interference;

(v) repeating operations (ii), (iii), and (iv) one or more times to produce multiple power spectral density values; and (vi) repeating operations (i), (ii), (iii), (iv), and (v) one or more times to add power spectral density values to the multiple power spectral density values; and one or more processing devices configured to perform operations comprising:

(vii) obtaining a power spectral density of the device signal having at least some of the intermodulation interference from the frequency spectrum analyzing device removed by performing an optimization process that is based on the multiple power spectral density values.

14. The system of claim 13, wherein the optimization process produces the power spectral density of the device signal and the following power densities:

a first power spectral density based on the intermodulation interference produced by the frequency spectrum analyzing device;

a second power spectral density based on the noise signal; and a third power spectral density based on an intermodulation correlation power associated with the device signal and the intermodulation signal of the frequency spectrum analyzing device.

15. The system of claim 14, wherein the power spectral density of the device signal does not include all or part of each of: the first power spectral density, the second power spectral density, or the third power spectral density.

16. The system of claim 15, wherein the power spectral density of the device signal comprises an intermodulation component from the DUT.

17. The system of claim 13, wherein the optimization process comprises the following operations:

(viii) selecting a frequency value among multiple frequency values;

(ix) performing an optimization using ones of the multiple power spectral density values associated with the selected frequency value; and (x) repeating operations (viii) and (ix) one or more times to obtain values for the power spectral density of the device signal.

18. The system of claim 13, wherein the attenuation value is set in a digital step attenuator (DSA), the DSA being part of the frequency spectrum analyzing device.

19. The system of claim 13, wherein the attenuation value is set in a digital step attenuator (DSA), the DSA being external to the frequency spectrum analyzing device.

20. The system of claim 13, wherein the attenuation value is set in a digital step attenuator (DSA), the DSA being between the frequency spectrum analyzing device and the DUT.

21. The system of claim 13, further comprising:

a test instrument comprising the one or more apparatuses and the one or more processing devices.

22. The system of claim 13, further comprising:

a test instrument comprising the one or more apparatuses; and one or more computing devices comprising the one or more processing devices.

23. The system of claim 13, wherein each frequency value corresponds to a bin covering a span of multiple frequencies.

24. The system of claim 13, wherein the DUT comprises network infrastructure equipment and the frequency spectrum analyzing device comprises a vector signal analyzer.

* * * * *